United States Patent [19]

De Los Santos et al.

[11] Patent Number: 4,514,691
[45] Date of Patent: Apr. 30, 1985

[54] BAGGAGE INSPECTION APPARATUS AND METHOD FOR DETERMINING PRESENCES OF EXPLOSIVES

[75] Inventors: Armando De Los Santos; James D. King; William L. Rollwitz; George A. Matzkanin, all of San Antonio, Tex.; Phillip A. Hornung, Fremont, Calif.

[73] Assignee: Southwest Research Institute, San Antonio, Tex.

[21] Appl. No.: 485,220

[22] Filed: Apr. 15, 1983

[51] Int. Cl.³ .......................................... G01R 33/08
[52] U.S. Cl. .................................. 324/301; 73/61 R; 324/310
[58] Field of Search ............... 364/496, 500; 324/300, 324/306, 313, 310, 316; 250/303, 358.1

[56] References Cited

U.S. PATENT DOCUMENTS

| 3,419,793 | 12/1968 | Genthe et al. | 324/306 |
| 4,166,972 | 9/1979 | King | 324/310 |
| 4,296,378 | 10/1981 | King | 324/313 |
| 4,357,667 | 11/1982 | Skarlos | 73/61 R |

Primary Examiner—Michael J. Tokar
Attorney, Agent, or Firm—Gunn, Lee & Jackson

[57] ABSTRACT

This method and apparatus are directed to baggage inspection, and more particularly, baggage inspection to locate explosives. In the preferred and illustrated embodiment, a conveyor system is utilized to transport a bag past a first magnet to achieve an initial nuclear magnetic resonance (NMR) polarization of a selected element. The element in the preferred embodiment is hydrogen, it being noted that hydrogen in explosives has a long $T_1$ and a short $T_2$. The first magnet provides an initial polarization. The bag continues on the conveyor belt past a second magnet. The second magnet provides the measurement field intensity and a coil contains an interacting RF forming the interrogation pulses. Echos are received. In the preferred embodiment, first and subsequent second echos are received and stored. The two signals are subtracted from one another to a null. The NMR response of elemental hydrogen in compounds typified by explosives (having a long $T_1$ and short $T_2$) is accented by subtraction of the two stored signals to form a response indicative of explosive materials. The apparatus includes means for adjusting the magnetic field to accommodate distortions for metal in the baggage.

26 Claims, 6 Drawing Figures

BAGGAGE INSPECTION APPARATUS AND METHOD FOR DETERMINING PRESENCES OF EXPLOSIVES

BACKGROUND OF THE DISCLOSURE

This invention was made under U.S. Government contract FA77WA-3978 and the U.S. Government has a non-exclusive, non-transferable, irrevocable, paid up license to practice, or have practiced for or on behalf of the U.S. Government this invention throughout the world.

Earlier issued U.S. Pat. Nos. 4,166,972 and 4,296,378 describe NMR inspection systems with some emphasis on explosives. This disclosure sets forth a method and apparatus which particularly yields a baggage inspection system to determine the presence of bulk explosives.

Checked airport baggage may conceal explosives. It has been determined that a quantity of explosives sufficient to blow a hole in the side of aircraft must exceed a certain quantity. The problem is one of detecting this minimum quantity of explosives in and among the other items normally found in baggage. Items normally found in baggage encompass a tremendous range of materials.

In particular, the explosive detection technique of this disclosure is not defeated or falsely triggered by normal baggage contents. This apparatus is particularly beneficial in detecting many types of explosives (e.g., slurry and emulsion mixes of various explosive compounds). Explosives are typified by nitroglycerine and ammonium nitrate dynamites, water gel explosives, RDX, TNT, PETN, and possibly other high energy explosives or propellants.

Explosives in small quantities pose different problems from that engendered by large explosive masses secreted in airborne baggage. An arbitrary quantum (such as twelve ounces) may be sufficiently powerful that, if exploded in the aircraft, the fuselage of the craft will be blown partly away, at least depressurizing the cabin. That creates significant risk, perhaps even causing a crash. The present invention sets forth a structure having as one feature the ability to detect through NMR interaction the atomic nuclei of the materials in the baggage utilizing an externally applied magnetic field interrogated with an RF pulse of specified description. In the preferred embodiment, the element of interest is hydrogen which is chemically bound in the explosives. Accordingly, hydrogen in a certain quantum of compounds (typified by the explosives) interacts with the magnetic field of specific intensity and the RF interrogation at a specific frequency to form an output signal to determine the presence or absence of explosive materials.

The apparatus of the present disclosure particularly has to be able to handle conventional sized and shaped baggage. This refers to typical baggage currently in use. Such bags are typically formed of a surrounding metal frame with metal hinges and locks. The envelope of the bag is typically formed of plastic, cloth, leather and other nonmetallic materials. A metal detector is also included in the apparatus to determine the presence a metal clad bag. This disclosure sets forth a system having a conveyor which delivers the bags in an upright orientation through a first magnet for polarization. The bags pass through on the fly to be exposed for a specified interval to a magnetic field intensity of a selected level to achieve initial polarization of any hydrogen nuclei in the materials within the bags and the bags themselves. Hall sensors arranged along a line at specified locations within the conveyor system are deployed in vertical alignment to measure the magnetic field intensity changes as each bag passes. Field intensity measurements for every inch of travel provide a multipoint grid mapping the magnetic field intensity externally of the bag and inferentially in the bag. This enables a profile to be determined, indicating excessive distortions of the magnetic field impinging on the bag. Ferromagnetic metals in the bag (or its contents) will cause some distortion. The distortion usually reduces the field intensity in most areas inside the bag; intensity perturbations are mapped and momentarily stored in memory to enable field adjustment to obtain the desired field intensity in the bag.

The bag passes through a second magnet. The second magnet is an electromagnet with a main coil and a booster or shim coil. The booster coil is temporarily operated by an amount to boost the field intensity imposed by the second magnet to overcome field perturbations in a bag. The booster coil in conjunction with the second magnet main coil magnetizes the area where the bag passes, the field strength being increased to overcome the perturbations inside the bag inferred by the sensors in the field of the first magnet. Accordingly, the second magnet and the booster coil (as required) tailor the second field intensity after determining distortions from the first field, thereby assuring that the second field is the intensity required for resonance inside the bag.

The bag is inspected a first time in the second field, and after a fraction of a second, it is inspected a second time. Recognizing that the field imposed on the bag for the first and second inspections is the same (the conveyor having stopped), the device is able to detect an altered NMR response from the first inspection and the second inspection. The two responses are stored. The second inspection is inverted and the two are then added. The response of most materials is approximately consistent between the first and second inspections and hence will cancel and null to zero or nearly so. Explosives are in the category of materials having a long $T_1$ and short $T_2$. Explosive materials above a specified quantity with this $T_1$–$T_2$ characteristic form a unique indication. That is, the NMR response of the first inspection is different from the NMR response of the second inspection. The difference in the two signals yields information indicative of materials having a long $T_1$ and short $T_2$, and this category includes explosives; very few other materials have a long $T_1$ and short $T_2$.

The present disclosure takes advantage of the fact that explosives are grouped in a particular category, this category not including a large number of other materials typically found in bags. The rate at which a hydrogen nuclei becomes aligned or polarized with an applied field is an exponential function which is controlled by the spin-lattice relaxation time constant, $T_1$. This time constant can range from several seconds down to only a fraction of a second. To obtain an NMR signal of reasonable amplitude, the material must be exposed to the magnetic field for a time comparable to $T_1$. Ideally, the exposure should be several fold larger to obtain the maximum possible signal to have optimum sensitivity. Most explosives have $T_1$ in the order of several seconds; some explosives have a $T_1$ which ranges upwards of several hundred seconds.

As described in the above mentioned patents, a magnetic field crossing technique can be used to achieve more rapid polarization without waiting an interval equal to many fold $T_1$. This takes advantage of another factor which achieves more rapid polarization, all more fully described in the references mentioned.

There is a second time constant which describes the NMR response of a material, and that is $T_2$, or the spin-spin relaxation time. This time constant sets forth the rate of decay of the transient NMR signal which follows transmitted pulses of RF energy. Typical values of $T_2$ are in the range of a few microseconds for hydrogen in many solids. The second time constant is very short for explosive materials. As will be understood, a long $T_1$ and short $T_2$ not only encompasses explosive materials but also a few materials which are not explosive. These materials are not commonly found in airline baggage.

The present apparatus utilizes a first magnet to achieve initial polarization. The bag is passed through the first magnet on the fly. This initiates polarization of hydrogen in compounds of the bag and its contents. The field imposed on the bag in the first magnet is relatively high. The field is slightly lower at the second magnet. Within the second magnet, the bag is momentarily stopped. There are coils arranged to form a right angle field to the field of the second magnet. The coils transmit timed RF pulses. For optimum detection, the pulse energy must cause the axis of the nuclei to rotate 90° relative to the original field. This is called a 90° pulse. It is sized by controlling the pulse duration (in microseconds) and pulse magnitude to thereby obtain right angle rotation. A second pulse is preferably phase shifted by 90° from the first pulse. Both pulses occur within a time period relatively short compared to $T_2$ of the explosive bound hydrogen. This yields an NMR echo that is relatively easily detected. Selected pulse duration and spacing between pulses particularly enhances NMR data.

There is one explosive which has a very long $T_1$, in the range of 300 seconds. This cannot be normally polarized in the interval permitted for baggage inspection. However, the imposition of a specific magnetic field intensity to achieve crossover shortens the time required for polarization of this explosive. As mentioned in the references, this crossover is achieved by matching the frequency of the hydrogen NMR to correspond with the frequency of nitrogen nuclear quadrupole resonance (NQR). This short cuts the long wait; polarization takes advantage of the coupling between nitrogen to hydrogen to thereby achieve energy transfer and quick polarization. This reduces $T_1$ for the hydrogen in this class of explosives from about 300 seconds to about 0.1 second. In light of this marked polarization reduction, it is preferable to pass a bag through a magnet of more or less uniform field intensity above the cross over field intensity. The first magnet in this disclosure is operated in the range of 785-825 Gauss. Crossover field intensities occur whereby the NQR frequency of nitrogen in the explosive compounds couples energy from the nitrogen into the bound nuclei of hydrogen, this field being sustained for 0.1 seconds or greater, thereby achieving quick polarization of all of the hydrogen nuclei in the materials. The materials are thus polarized.

Crossover intensity is achieved on the fly. This additionally defines a scale factor for the present apparatus. It is preferable to advance the bag to be inspected at a velocity of a few inches per second. An acceptable velocity is about two feet per second on the conveyor system. The conveyor system carries the bag past a magnet approximately three feet in length on the fly; the bag is exposed to crossover intensity for an adequate time.

This apparatus includes an immediately adjacent second magnet. The bag is stopped within the second magnet. A single inspection sequence can be made on the entire bag. A second or duplicate inspection sequence is made, and both inspections can be achieved with a single coil encompassing the entire bag. It is advantageous to divide the bag into smaller sections. The volume of space encompassed in one coil is quite large. It is better to divide the space by utilization of two or three smaller coils along the length of bag and obtain data from each coil. The data from the first inspection sequence (from all coils) is summed, and this inspection sequence is repeated; the two sets of data are subtracted to obtain only explosive indicative signals. There is a relatively short delay between the two inspections, typically one second or less. In the preferred embodiment, this is about 0.5 to about 0.75 seconds.

Through the use of appropriately timed and located third (and/or fourth) pulses in each RF test sequence, materials which have a long $T_1$ and long $T_2$ can be determined and discriminated. These materials are glycerol based, and alcohol based materials. Pure glycerol changes when mixed. Glycerol based materials refers to mixtures of glycerol having relatively long $T_1$ and long $T_2$. These are found in hand lotions, shaving lotions and the like. If a third (and/or fourth) pulse is used and glycerol based materials having a long $T_1$ and $T_2$ characteristics are present, the latter echo(s) yields significant discrimination. If $T_2$ is short, the latter echo(s) is nil. If a glycerol based material (long $T_1$ and long $T_2$) is present, the echo after the third and/or fourth pulse is quite large. Thus, by evaluating amplitude differences between the first echo (the echo after the second pulse) and the latter echo(s) (arising after the third and/or fourth RF pulse), the materials having a long $T_1$ and long $T_2$ characteristics will be discriminated.

All the foregoing is accomplished in the apparatus which is described in detail below. One of the features of this apparatus is that it furnishes a highly efficient automated baggage inspection apparatus and method. More particularly, the device is able to detect explosives characterized by chemically bound hydrogen nuclei having a long $T_1$ and relatively short $T_2$ for several classes of explosives, this being accomplished by the equipment and procedure described in greater detail hereinbelow.

BRIEF DESCRIPTION OF THE DRAWINGS

So that the manner in which the above recited features, advantages and objects of the present invention are attained and can be understood in detail, more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
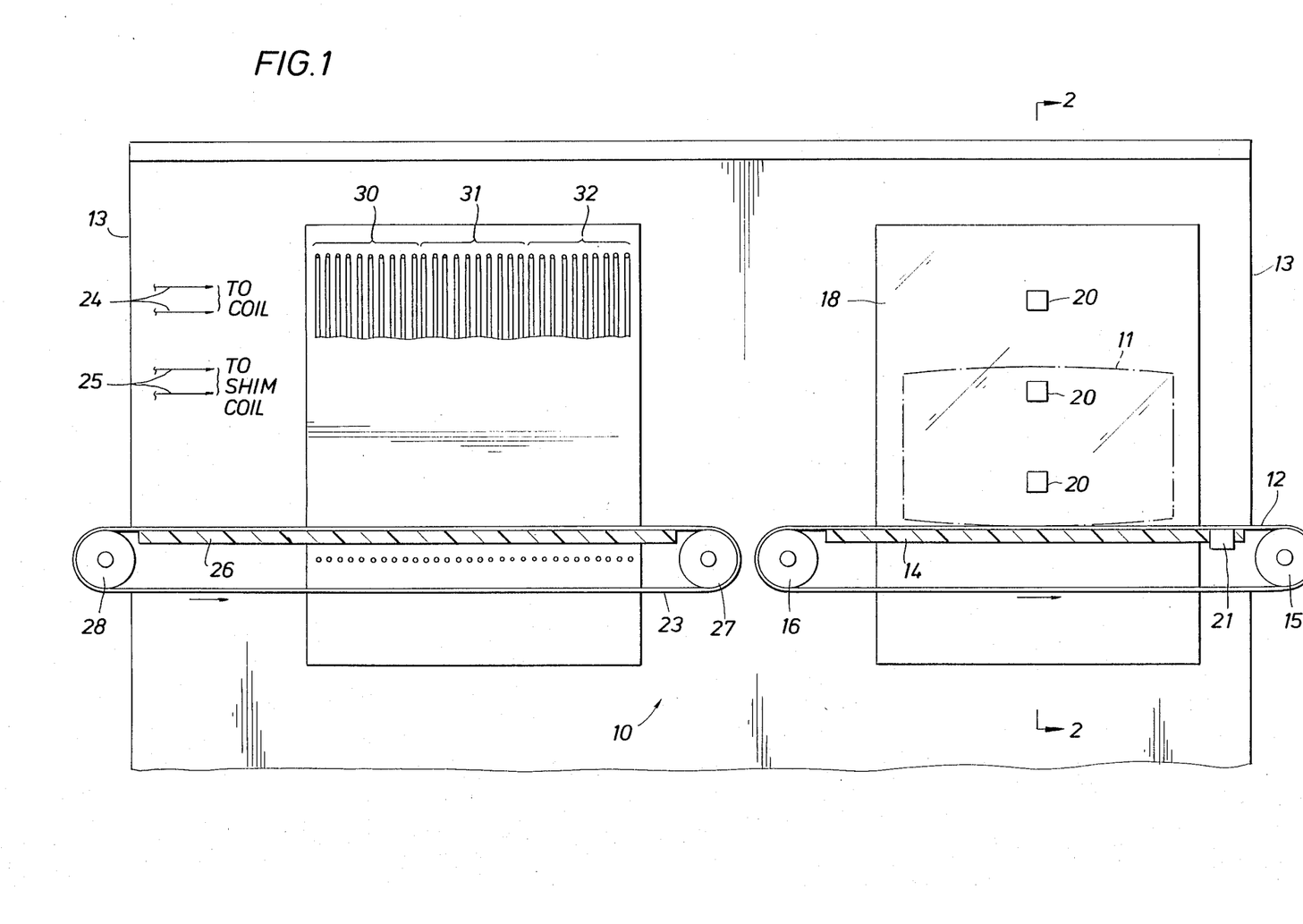
FIG. 1 is a sectional view through the conveyor system of the present invention showing the routing of baggage through the apparatus to be inspected for explosives.
Figure 2:
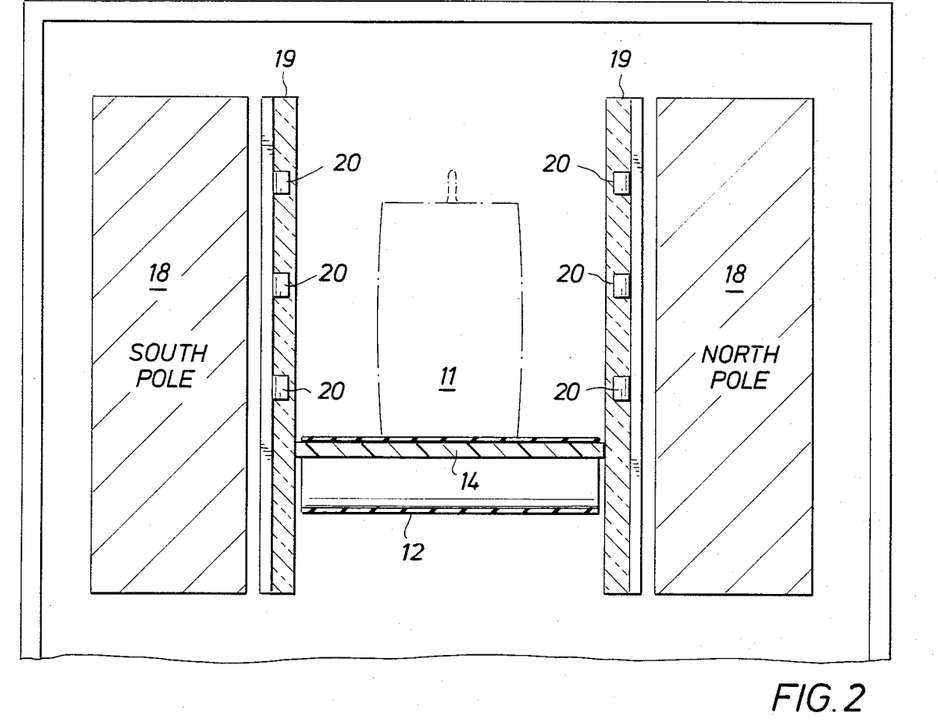
FIG. 2 is a sectional view along the line 2—2 of FIG. 1 showing details of the conveyor system.

Attention is first directed to FIGS. 1 and 2 of the drawings to be considered jointly. A conveyor system for handling baggage is identified by the numeral 10 which refers to the baggage inspection apparatus. A bag 11 is placed on a conveyor belt 12. The conveyor belt 12 travels into a cabinet or housing 13. The cabinet 13 encompasses all of the equipment exposing the marginal ends of the conveyor belt system for on and off loading. There is a level backing plate 14 beneath the conveyor to maintain it in a level path. The conveyor is equipped with an idler wheel 15 and a driven wheel 16. The bag 11 is carried in an upright posture on the belt. The bag passes between the poles of a very large magnet 18. The magnet is formed by positioning a pair of opposing poles opposite one another as shown in FIG. 2. Magnetic field lines are uniformly formed between the two pole pieces perpendicular to the plane of FIG. 1.

Separate mounting blocks 19 containing field intensity measuring sensors 20 such as Hall sensors are arranged in a vertical line. They are mounted directly on the pole piece and to the side of the bag 11 to measure field intensity at different elevations at the bag. They are located within the marginal edges of the pole 18. That is, without disturbances, sensors are located in a portion of the magnetic field where the magnetic intensity is normally uniform with no bag present. The magnetic field is not disturbed by the conveyor 12 or the backing plate 14 because they are preferably made of non-magnetic materials. The Hall sensors 20 measure perturbations in the field as a result of the passage of the suitcase 11. All metallic suitcases are detected by means of a metal sensor 21 located very near the front end of the equipment. As soon the bag 11 is moved over the metal detector 21, readings obtained at the control system abort the test procedure for metal clad structures.

The conveyor 12 is operated at a specified velocity, and two feet per second has been found quite acceptable. The magnet 18 is quite long, spanning the length of an average large bag. The magnet 18 is preferably about twenty-five inches in the direction travel. It forms a uniform field (before disturbance) which intercepts the path of the conveyor. This enables polarization of a bag of any length within the height and width of the tunnel opening above the conveyor. These are scale factors which can be changed. The conveyor terminates immediately adjacent to a second conveyor belt 23. This belt passes into a second magnet 24. A booster or shim coil 25 is also included in the magnetic circuit of the second magnet. The conveyor 23 travels over a nonmetallic backing plate 26 driven by a motorized drive wheel 28 and passes around an idler 27. Immediately adjacent to the interior of the magnet pole pieces, there is a coil assembly constructed to form a RF field at right angles to the magnetic field. There are three coils in the assembly, each having multiple turns. The three coils are conveniently identical. The left hand coil is identified by the numeral 30, the center 31 and the right hand 32. They are approximately equal in span, this being about ten inches of travel in the preferred embodiment. Accordingly, the coils total about thirty inches in travel along the conveyor system. They are sufficiently long to encompass the volume of the tunnel above the conveyor, passing beneath the conveyor, thereby assuring that the maximum size bag is inspected. The shim coil 25 boosts the magnetic field intensity approximately coincident with the largest bag profile to overcome perturbations in the bag.

Figure 3:
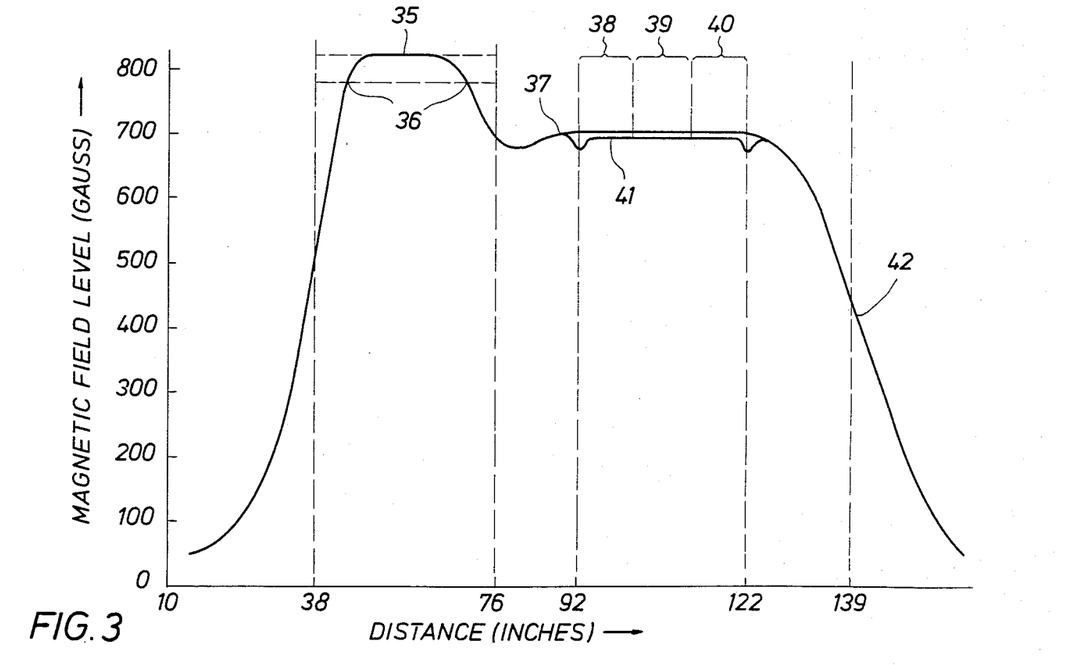
FIG. 3 is a graph of magnetic field intensity in Gauss versus position along the conveyor system shown in FIG. 1.

Attention is next directed to FIG. 3 of the drawings which is a graph of magnetic field level measured in Gauss versus distance through the machine along the conveyor system. As a practical matter, the conveyor systems extends conveniently forward of and to the back of the machine to enable baggage handlers to deliver and retrieve the bags in an upright position on the conveyor system. Accordingly, there are exposed portions of the conveyor system at the front and back ends. As a bag travels along the conveyor system, it is introduced into the region of the first magnet. Referring to FIG. 3, the bag moves into the magnetic field, and is then exposed to a magnetization peak 35 on the graph of FIG. 3. The peak 35 is preferably about 800–825 Gauss. Even though the bag is moving, the field is relatively uniform and relatively wide. As a result, there is a fairly prolonged polarization field which impinges on the bag, thereby initiating polarization of bound hydrogen in the compounds which makeup the bag and all of its contents. This region 36 comprises the polarization region.

The bag continues through the region 36 in continuous fight. The region 36 accomplishes polarization, even for those hydrogen bound compounds which have extremely long $T_1$, say 300 seconds for one type of explosive. The field intensity is of such an amplitude to assist more rapid polarization by means of crossover energy coupled through the NQR of nitrogen in the hydrogen-nitrogen bonds which exist within this class of explosives. This shortens the time required for polarization from perhaps hundreds of seconds to about 0.10 second if the field encountered by the hydrogen nuclei is at the crossover field value with nitrogen. This occurs on crossover at some field strength, typically passing through the crossover field strength.

The magnets 18 and 24 are relatively close to one another within a confined cabinet or housing 13. They are arranged so that the north poles of both magnets are located on the same side of the conveyor and hence the fields have the same direction. They are further arranged so that there is a fairly significant magnetic field saturation along the conveyor system beyond the throat of the magnet 18. The magnetic field at the second magnet is reduced. This might be in the range of about 700 Gauss or slightly higher. Moreover, the field is fairly level or uniform as indicated at 37. That field segment is divided into three portions at 38, 39 and 40. These three sections correspond to the location of the three coils. The three coils are encompassed within the span of pole pieces defining the second magnet system.

It will be recalled that there is a possibility that field intensity in a particular bag may be distorted. Consider the typical case of a bag having a peripheral metal framework, metal handles, three metal hinges and locks. Assume such a bag carries two or three spray canisters which may distort the magnetic field. The magnetic field distortion typically reduces the magnetic field intensity within the bag. This distortion of field intensity within the bag reduces the level 37. Recall that FIG. 3 shows the magnetic field level without disturbance. A disturbance can occur where the field is dropped to the level 41 shown in FIG. 3. That is, the field just adjacent to the frame of the bag will be distorted to this level. This reduction in field intensity within the bag is accompanied by excessive field strength on the exterior of the bag; needless to say, field strength outside the bag is meaningless. The shim coil 25 shown in FIG. 1 is included to increase the magnetic field strength to raise the level 41 back to the level 37 within the bag. As will be observed in FIG. 3, the field intensity drops at 42, this being a location outside the cabinet or housing and on the marginal end of the conveyor system.

NMR DATA RECOVERY

Figure 4:
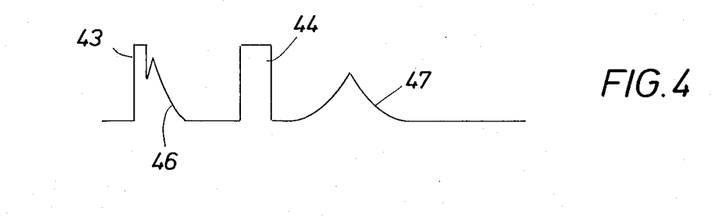
FIG. 4 is a simple representative response of an echo pulse to RF pulses in NMR interrogation.

Attention is momentarily directed to FIG. 4 of the drawings. A free induction decay (FID) signal is indicated there. Briefly, the time versus RF output signal of FIG. 4 includes a first transmitted pulse 43 and a second transmitted pulse 44. The first pulse causes a FID signal 46 which arises on the trailing edge of the first transmitted RF pulse 43. The pulse lengths 43 and 44 correspond to 90° rotation of the nuclear magnetic moment. The echo 47 is the echo pulse which encodes the information of interest regarding the nuclei.

Figure 5:
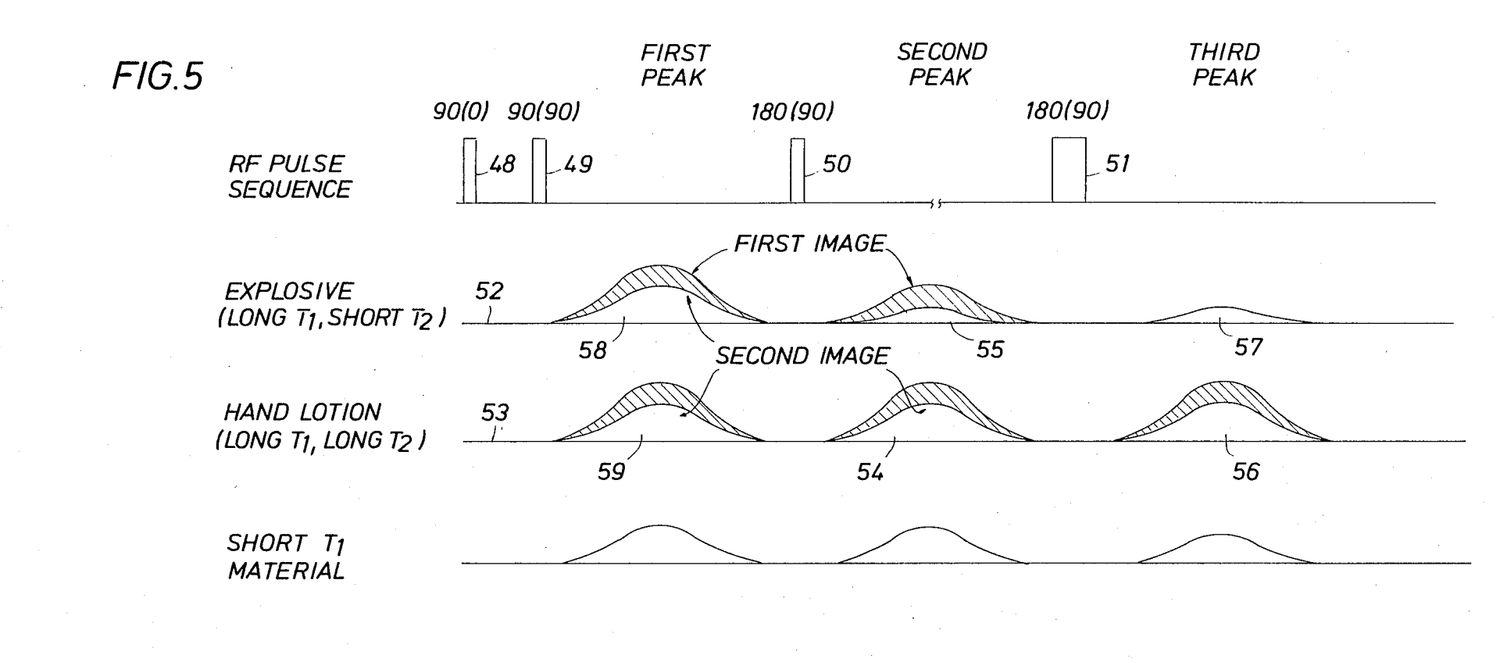
FIG. 5 is a sequence of responses obtained from an explosive in contrast with a hand lotion.

This perhaps is better shown in FIG. 5 of the drawings. There, a first transmitted pulse identified by the numeral 48 and a second transmitted pulse 49. are separated by a time span $\tau$. A third transmitted pulse 50 is offset by nominally $2\tau$. Another transmitted pulse 51 is typically at a much greater delay.

An explosive is typically a hydrogen compound characterized by a long $T_1$ and a short $T_2$. Glycerols based materials, alcohols or alcohol based materials have long $T_1$ and long $T_2$. A hand lotion made of glycerol based materials and alcohol is shown in FIG. 5. The response of an explosive is identified at 52 to compare with the hand lotion response 53. A third material with a short $T_1$ is shown at 54. Comparing the graphs 52 and 53, it will be observed that the explosive and hand lotion both form a first and second peaks. The third peak 56 is much larger for the hand lotion compared to the small peak 57 for the explosive. Comparing especially the third peak of the sequence, the explosive graph 52 is thus characteristically distinguished from hand lotion, hand lotion being a typical material found in baggage having a long $T_1$ and a long $T_2$.

FIG. 5 shows at 54 the NMR response of materials which have a short $T_1$. These materials are not difficult to discriminate. Only those few materials including glycerol based materials, alcohols or alcohol based materials and similar chemical compounds pose any problem whatsoever and they are preferably handled in the fashion shown in FIG. 5, that is, by contrasting the responsive pulse trains 52 and 53. Clearly, FIG. 5 depicts the difference in such materials.

In data handling as described with regard to FIG. 5 so far, a method of distinguishing explosive (long $T_1$ and short $T_2$) from materials with long $T_1$ and long $T_2$ has been described. In common circumstances, additional discrimination must be obtained. This is done by obtaining first and second images from the bag and its contents (of whatever variety of materials) with the images obtained and subtracted. The two images are made only a fraction of a second apart. The two images are then subtracted from one another.

Consider the possibility that there are short $T_1$ materials in the bag. If so, the two images are sufficiently spaced that the magnetic moments of hydrogen nuclei have time to be repolarized before the second image is made. Thus, the hydrogen nuclei (with long or short $T_1$) are initially polarized before the first image is formed. The RF pulse transmitted into the bag disturbs the polarization to obtain the first image. On waiting about 0.5 seconds to get the second image, the short $T_1$ hydrogen materials have adequate time to repolarize in the second magnetic field. When the RF pulses are then formed, the second image should be identical to the first image insofar as the short $T_1$ materials are concerned.

By contrast, explosives are long $T_1$ materials. Hydrogen nuclei in explosive compounds do not have adequate time to be repolarized. The repolarization of the long $T_1$ materials is only slightly accomplished prior to obtaining the second image. Most long $T_2$ hydrogen nuclei are not aligned at the start of the RF pulses used to obtain the second image. This random initial alignment of the long $T_1$ materials cause the NMR response in the second image to be smaller than the first image. On subtracting the two images from one another, the NMR responses are different for explosives (long $T_1$ materials), and the differences are sufficiently large to provide an alarm condition.

It should be recalled that small quantities of explosives do not have significant amplitude to form a large NMR response. If an explosive hidden in a bag is present and the size is greater than a minimum, then the NMR amplitude will be large, at least above a threshold level. The large NMR response will be noted in the first image, and the response will be smaller in the second image.

FIG. 5 shows two traces or signals at 52, the signals being plotted relative to the RF pulse sequence. The two signals contrast the two images in the difference between signal peaks. The first image is much larger, the difference being shaded in FIG. 5.

The shaded area in the signal 52 is observed after the two images are subtracted from one another. This difference is larger for larger explosive masses, and hence, the system indicates the presence of explosives.

Long $T_1$ materials include materials such as hand lotion in FIG. 5. These materials are distinguished by the third peak response in FIG. 5. Such long $T_1$, long $T_2$ materials are distinguished by the large third peak 56 compared to the explosive third peak 57.

Short $T_1$ materials provide first and second image signals which are nearly identical; they are distinguished by first and second image comparison to obtain a null output.

Explosives are distinguished by subtracting to obtain the shaded area on the signal 52; the signal 53 (from hand lotion) also shows a shaded area but recall that such materials are distinguished by the third peak 56 response. In conclusion, the NMR peaks (58, 59 and 57 on the signal 52) compared to the peaks 59, 54, and 56 on the signal 53 yields an explosive indicative signal.

Importantly, coherent RF peak modulation as a result of standing waves and the like are nulled by subtracting the two images from one another. In the closed cabinet, there tends to be some ringing and hence modulation of the signals. Such coherent noise is cancelled.

CONTROL CIRCUITRY

Figure 6:
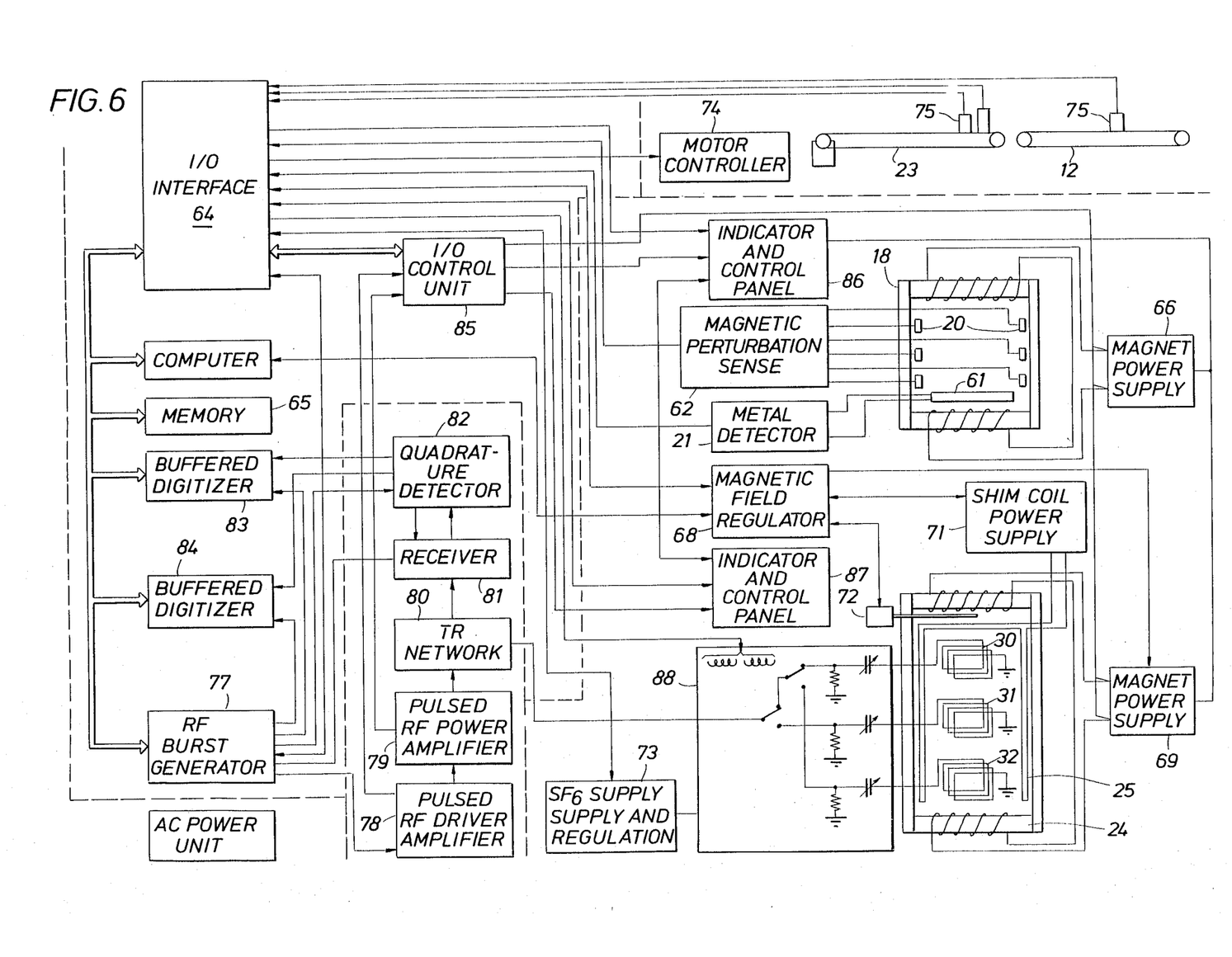
FIG. 6 is a block diagram of a system including circuitry for operation of the baggage inspection equipment.

Attention is directed now to FIG. 6 of the drawings. In FIG. 6, the magnet 18 is shown with a set of coils for its operation. There is a detector 61 for a metal detector 21. FIG. 6 further shows several Hall sensors 20, these being located along the sides of the path for the baggage as shown IN FIG. 1. The Hall sensors 20 are connected to a magnetic perturbation sense circuit 62. It is input to an interface circuit 64 and converted into data stored in memory 65 and used to operate the shim coil to be described below. The first magnet 18 is powered by a suitable set of coils which are in turn connected with a magnet power supply 66. The power supply 66 is set and normally not altered. Variations are observed by the Hall sensors 20; these variations are obtained on a timed sequence and hence define multiple field intensity measurements in an X-Y grid over a bag. That data is stored in memory at 65. The memory stores the data which is evaluated for perturbations, and as appropriate, a control signal for a magnetic field regulator 68 is then formed. The control signal is input to the magnetic field regulator 68. That regulator is able to control the shim coil power supply 69 to boost the field of the second magnet 24. In addition, the magnetic field regulator 68 supplies power provides control to the main magnet power supply 69. The main magnet power supply 69 is normally set with no bag in its field; the strength is accurately controlled.

There is a rotating coil field sensor 72 located in the area of the second magnet 24. It is also input to the magnetic field regulator 68. This provides the long term regulation of the second magnet to assure that the unperturbed field of the second magnet is maintained at the required level. The required level was discussed in relation to FIG. 3 of the drawings. Field regulation is within a fraction of a Gauss.

A single RF coil can be used. The preferred embodiment utilizes three identical RF coils which are adjacent to one another. They are identified by the numerals 30, 31 and 32 in FIG. 6. They are each part of separate tank circuits. Each one includes its own capacitor. The several capacitors are powered by a large pulse provided from other circuitry. Through suitable switches, one of the tank circuits can be selectively coupled to the circuitry providing the transmit pulses and receiving signals thereafter.

For protection, the capacitors and coils are maintained in an atmosphere of $SF_6$. This serves as an arc suppresant, and there is therefore a supply and regulation system 73 included in FIG. 6.

The interface 64 connects with a motor controller 74. That controls a motor for the conveyor system. In particular, the motor controller 74 operates the conveyer 23. As further shown in FIG. 6, there are suitable position sensors 75 at various locations along the conveyors. This enables the equipment to determine the whereabouts of the bag that is undergoing inspection. It will be further recalled that the first and second conveyors are periodically stopped and started synchronously.

The present apparatus further includes a pulsed RF burst generator 77. It forms pulses in timed sequence at the right frequency. They are input to a pulsed RF amplifier 78. They are then applied to a pulsed RF power amplifier 79. That in turn is connected to a TR network 80. This is the switch gear which switches between transmit and receive. In the transmit mode, it delivers a large pulse, perhaps even one megawatt in peak power. The large pulse is delivered as a very large pulse for the coils. Moreover, the TR network connects with a receiver 81. The receiver in turn is connected to a quadrature detector 82. That forms an output which is connected to the buffered digitizers 83 and 84. In like fashion, the RF burst generator 77 is also connected to the buffered digitizers 83 and 84. An I/O control unit 85 in conjunction with an indicator and control panels 86 and 87 enable the operator to direct the operation of the system. The particular tank circuit energized to transmit is selected by the switch circuitry 88.

DESCRIPTION OF OPERATION

Referring now to the apparatus shown in FIG. 6, one sequence of operation will be traced. Assume that a bag placed on the conveyor belt has no metal in it other then a relatively common peripheral steel frame around the edge. It is placed on the moving conveyor 12. It travels along the conveyor into the region of the first magnet 18. Polarization of the nuclei is initiated, this being accomplished by the magnet 18. After polarization has started for each portion of the bag 11, the sensors 20 arrange along a central vertical line adjacent to the magnet 18 measure the perturbations in magnetic flux. Assuming that the magnetic intensity should be around 800-825 Gauss as shown in FIG. 3 at 35, variations in field are measured. Such measurements may show an increase in flux to the exterior of the bag 11. That is typically accompanied by a decrease in flux strength on the interior of the bag 11. Inspection obviously is required on the interior, not the exterior. As the lines of flux are distorted, such distortions are noted at the sensors 20. Indeed, two rows of sensors can be included, one on each side of the conveyor path, this for the purpose of measuring flux variations on both sides in the event the bag is not centrally located on the conveyor. Whatever the fact, data is obtained. The data is stored and analyzed. If it reflects a pattern indicative of a decrease in field intensity within the bag, this data is recognized in a pattern recognition analysis from the stored data. If there are three sensors on each side (a total of six sensors 20), and if a reading is taken every inch, then a twenty inch bag will be described by twenty data points along its length, or 120 data points total. The six vertical data points are typically averaged. Since the disturbances fall in predictable patterns, it is relatively easy to find and observe patterns. The degree and extent of change is examined, and this pattern recognition is implemented by forming a signal for the magnetic field regulator 68. That signal changes the power setting of the shim coil power supply 71. This will slightly increase the field intensity of the second magnet 24. This will boost the curve experienced by the bag 11, thereby raising the curve 41 to the level at 37 shown in FIG. 3. Needless to say, that portion of the memory can be erased and the pattern can be observed for the next bag to be inspected.

Going further with FIG. 6, if an all metal container is passing over the sensor 61, a suitable signal is formed by the metal detector 21. This signal causes the test to be aborted to enable hand inspection. Otherwise, the inspection contemplated by this apparatus continues.

The bag moves through the first magnet on the fly; the bag 11 then is carried by the conveyor 23 and moves to an inspection location stopped adjacent to the second magnet 24. Going now to FIG. 5 of the drawings, one test sequence is illustrated. Assume that the bag 11 is of maximum size and is filled with the usual variety travellers normally carry in their luggage. Assume further that there is no explosive material within the baggage. Looking at FIG. 5, one observes a pulse sequence which is applied to the baggage. First of all, the RF pulse sequence involves the transmission of pulses 48–51. The first three pulses are nominally 90°, that is, they contain the energy required for a 90° rotation of the polarized hydrogen nuclei. The interval between pulses 48 and 49 is nominally $\tau$; the interval between pulses 49 and 50 is nominally $2\tau$; the interval between pulses 50 and 51 is typically much longer. The pulses are scaled quite large in light of the relative size of the volume undergoing testing. The volume is the space contained within the coils. As stated before, it is possible to apply this pulse sequence to a single coil cooperative with a second magnet 24. On the other hand, it is desirable to test the baggage in segments. This can be obtained quite easily simply by breaking up the inspection volume into three coil portions. As an example, it is possible to apply pulses to the end coils in sequence and then the center coil.

The sequence shown in FIG. 5 is relatively brief, being accomplished within a few milliseconds. Accordingly, all three coils are separately supplied with the pulses shown in FIG. 5 to obtain data from the baggage 11. All this can be done quickly, approximately 170 milliseconds for three coils.

As will be observed in FIG. 5, responses from different materials are shown including an explosive and hand lotion. These responses are obtained from the respective transmitter coils (also receiver coils) by switching occasioned by the vacuum switches 88. The pulses are transmitted, and the response including echos is then received and recorded. If three coils are used, three sets of data are obtained. The three sets of data can be superimposed to represent one set of data.

A contrast should be noted between a bag which includes an explosive and a bag which includes no explosives. If secreted explosives are in the bag, the first test sequence or procedure will obtain a received data which is recorded as a function of time over a period of few milliseconds. That signal is preferably digitized and stored. Suitable data samples are taken so that the entire data train can be captured and stored.

After the passage of about 0.5 to 0.8 seconds, the entire test procedure is again repeated. A second set of data is obtained in exactly the same fashion by transmitting the same sequence of RF pulses as shown in FIG. 5. The two sets of data are both stored in digital form with a common sampling rate. The second is subtracted from the first set of data. If a null is obtained, no explosives are present. If a null is not obtained, that is indicative that an explosive is present in the container.

Primarily, this apparatus utilizes the pulse echo mode of hydrogen transient NMR detection. The preferred set of transmitted pulses is shown in FIG. 5. In this mode, transmission of an initial 90° pulse followed by two 90° pulses, which are phase shifted by 90°, extends the decay time of a solid hydrogen NMR signal. This effects better results in certain non ideal conditions. For optimum detection, the energy in each transmitted RF pulse must be the specific value which causes the axis of the hydrogen nuclei to be rotated by 90° relative to the field established by the second magnet 24. This is called a 90° pulse provided the product of the pulse duration (in microseconds) and the pulse magnitude (measured in Gauss in the field within the coil) yields a specified constant value. The pulse sequence must occur within a time period which is slightly longer then the $T_2$ values of explosives and also $T_2^*$ caused by magnet homogeneity. This allows relatively long $T_2$ materials to be discriminated from relatively short $T_2$ materials, as exemplified in FIG. 5.

One grouping of explosives discloses $T_1$ greater than three seconds and $T_2$ shorter than 100 microseconds. By this characterization, the relatively small hydrogen NMR signal from a few ounces of explosives can be reliably detected even when it is submerged in a large hydrogen NMR signal from other materials within baggage. For instance, the baggage may be formed of plastic materials of chained paraffin molecules. There is a large quantity of hydrogen in such a plastic mass. This apparatus is able to detect the NMR from such a large plastic mass and store that signal; on repeating the test procedure, the same signal should be obtained from the large plastic mass. When subtracted, the null is obtained.

For descriptive purposes, the first set of data will be denoted as the first image, and the second set of data will be described as the second image. If there are no materials having a long $T_1$ hydrogen bound material, the second image will be identical to the first image, and the two will cancel or null to zero. If there are hydrogen compounds with a long $T_1$, the two tests occur sufficiently close that the nuclei do not have time to realign before the second test. In other words, the first test so disturbs the hydrogen nuclei in explosives (those materials having a long $T_1$) that the second NMR test occurs before the nuclei have been repolarized. In this event, the second image NMR responses are much smaller. Differences in amplitude between the first and second images indicate a long $T_1$ material, possibly an explosive, or possibly an alcohol based material or a glycerol based material. From the foregoing, the two images are obtained so close that repolarization of explosive type materials cannot be accomplished in that short interval. This obviously reduces the NMR output signal in the second image.

The sequence shown in FIG. 5 depicts how different types of long $T_1$ materials are distinguished; the explosives provide only a small peak after the pulse 51 while hand lotion does produce a large third peak. To distinguish the two types of long $T_1$ materials, it is only necessary to observe the pulse 56. If it is present and large, the material is a glycerol based or alcohol based material. Another way that this can be achieved is to simply compare the third pulse with earlier pulses in the train; if they are equal, the material is a glycerol based or alcohol based material. Needless to say, the sequence of pulses can be extended to four or five pulses from the transmitter to further test for long $T_1$ material discrimination. The goal is to obtain an indication of explosives, those materials having a long $T_1$ and short $T_2$.

To provide a few scale factors, a initial first magnet field in the range of 775–825 Gauss is optimum, the possible range actually being even broader, perhaps 500–900 Gauss. If the field is sustained for 2.5 seconds, this is more than acceptable for a wide range of fields.

There is an RDX crossover field value in the range of 790 to about 830 Gauss which is preferably maintained for about 0.1 seconds at a minimum, and ideally greater than 0.2 seconds. This completely achieves crossover on the RDX hydrogen nuclei, that is, shortening of the $T_1$ as a shortcut by pumping energy into the hydrogen nuclei through its coupled nitrogen. The test inside the magnet 24 is typically accomplished at about 705 Gauss.

The foregoing is directed to the preferred embodiment but the scope is determined by the claims which follow:

What is claimed is:

1. Apparatus for conducting baggage inspection for explosives characterized by having a relatively long $T_1$ and relatively short $T_2$, the apparatus comprising:
   (a) a conveyor system for receiving and moving a bag thereon, the bag to be investigated for explosives above a certain quantity therein;
   (b) magnet means for forming lines of flux across the path of said conveyor system to intercept baggage thereon for polarizing hydrogen nuclei in the materials of the bag and its contents;
   (c) coil means for forming a right angle field to the field formed by said magnet at a selected RF frequency for an interval;
   (d) particle resonance detection circuit means connected to said coil means for determining a signal from materials within the baggage;
   (e) circuit means connected to said detection means for detecting signals from hydrogen in materials having a long $T_1$ and short $T_2$;
   (f) wherein said coil means is comprised of serially located separately connected multiple coils, the coils being separate to inspect different volumes of space along said conveyor system;
   (g) capacitor means for said coils to form separate tank circuits for each of said coils;
   (h) switch means connected to said tank circuits for selectively energizing first one and then a second of said tank circuits;
   (i) pulsed RF power amplifier means for forming a pulse of specified frequency and duration to be transmitted from said coil means wherein the output thereof is applied through said switch means.

2. The apparatus of claim 1 wherein said magnet means includes a first magnet adjacent to said conveyor system for achieving initial polarization of nuclei in the materials in the bag.

3. The apparatus of claim 2 including a separate second magnet for forming a second magnetic field parallel to the field formed by said first magnet.

4. The apparatus of claim 1 wherein said conveyor system includes a first conveyor portion proceeding past said magnet means for initial polarization of baggage on the fly, and includes a second conveyor portion wherein the baggage is held stationary to enable operation of said detection means.

5. The apparatus of claim 1 wherein said magnet means includes first and second separate magnets arranged to form fields along said conveyor system, and wherein said coil means is at right angles to said second magnet to initiate detection by said detection means of the baggage and its contents within the field of said second magnet and said coil means after initial polarization by said first magnet.

6. The apparatus of claim 1 wherein said magnet means includes a first magnet for forming a first magnetic field to polarize the materials of the baggage and its contents, and also includes a second magnet located serially along said conveyor system to form a second magnetic field encountered by the baggage and its contents after travelling through the first magnetic field, and further including a booster electromagnet to add to the magnetic field of said second magnet to increase the field intensity by a selected measure.

7. The apparatus of claim 1 including a metal detector arranged in proximity to said conveyor system for detecting a metal clad bag.

8. Apparatus for conducting baggage inspection for explosives characterized by having a relatively long $T_1$ and relatively short $T_2$, the apparatus comprising:
   (a) a conveyor system for receiving and moving a bag thereon, the bag to be investigated for explosives above a certain quantity therein;
   (b) magnet means for forming lines of flux across the path of said conveyor system to intercept baggage thereon for polarizing hydrogen nuclei in the materials of the bag and its contents;
   (c) coil means for forming a right angle field to the field formed by said magnet at a selected RF frequency for an interval;
   (d) particle resonance detection circuit means connected to said coil means for determining a signal from materials within the baggage;
   (e) circuit means connected to said detection means for detecting signals from hydrogen in materials having a long $T_1$ and short $T_2$;
   (f) wherein said circuit means includes timing means for forming a first set of interrogation pulses for said coil means;
   (g) storage means for receiving and storing a first image from said detection means;
   (h) storage means for receiving and storing a second image from said detection means; and
   (i) means for subtracting the first image from the second image to obtain a null indicative that no explosive material is present wherein the explosive is characterized by a long $T_1$ and a short $T_2$.

9. The apparatus of claim 8 further wherein said timing means is operated to obtain the second image sufficiently close after the first image that the hydrogen materials in explosives having a long $T_1$ do not have sufficient time to be repolarized prior to the second image wherein the hydrogen forms a different resonant response in the second image.

10. The apparatus of claim 9 wherein said magnet means is operated for a sufficient interval at a sufficient intensity to polarize bound hydrogen materials having a long $T_1$ and short $T_2$, and said timing means initiates the formation of the second image at a time after formation of the first image sufficiently short that $T_1$ repolarization is not accomplished.

11. Apparatus for conducting baggage inspection for explosives characterized by having a relatively long $T_1$ and relatively short $T_2$, the apparatus comprising:
   (a) a conveyor system for receiving and moving a bag thereon, the bag to be investigated for explosives above a certain quantity therein;
   (b) magnet means for forming lines of flux across the path of said conveyor system to intercept baggage thereon for polarizing hydrogen nuclei in the materials of the bag and its contents;
   (c) coil means for forming a right angle field to the field formed by said magnet at a selected RF frequency for an interval;
   (d) particle resonance detection circuit means connected to said coil means for determining a signal from materials within the baggage;
   (e) circuit means connected to said detection means for detecting signals from hydrogen in materials having a long $T_1$ and short $T_2$;

(f) wherein said magnet means is comprised of first and second separate magnets spaced serially along said conveyor system;

(g) magnetic field intensity sensor means deployed within the field formed by said first magnet from measuring the intensity of the field impinging on the baggage and its contents;

(h) magnetic field regulator means connected to said field sensor means; and (i) magnet power supply means operated by said magnetic field regulator means for forming a variable current applied to said second magnet for altering the magnetic field intensity formed by said second magnet to obtain a specified field intensity in the second field dependent in part on the measurement of said field intensity sensor means.

12. The apparatus of claim 11 further including timing means connected to a transmitter pulse forming means for forming a procession of pulses to be transmitted through said coil means, and wherein said pulses are spaced and timed pulses.

13. The apparatus of claim 12 wherein said transmitted pulses are supplied through a transmit and receive circuit means to said coil means, and wherein said detection means is connected through said transmit and receive circuit means to observe responses from said coil means.

14. The apparatus of claim 11 including memory means connected to said circuit means for receiving and storing sequentially obtained echoes observed at said coil means from materials within said coil means.

15. The apparatus of claim 11 wherein said magnet means is operated in a field intensity to initiate polarization of hydrogen in explosive compounds characterized by a long $T_1$ and a short $T_2$ and also at a level to achieve nuclear quadrature resonance with nitrogen in such explosives to initiate an energy transfer from the nitrogen to the hydrogen to thereby shorten the time required for polarization of the hydrogen.

16. The apparatus of claim 11 wherein said conveyor system includes a first conveyor portion proceeding past said magnet means for initial polarization of baggage on the fly, and includes a second conveyor portion wherein the baggage is held stationary to enable operation of said detection means.

17. The apparatus of claim 11 including a metal detector arranged in proximity to said conveyor system for detecting a metal clad bag.

18. A method of detecting explosives in baggage and the contents thereof comprising the steps of:

(a) passing the baggage through a first magnetic field to obtain polarization of hydrogen nuclei;

(b) placing the baggage in a second magnetic field after polarization;

(c) transmitting RF pulse energy into the baggage in the second field to initiate an NMR response;

(d) receiving the NMR response;

(e) storing the received NMR response to comprise a first image;

(f) repeating the step of transmitting RF pulse energy into the baggage to obtain a second NMR response; wherein the second NMR response is obtained so rapidly after the first NMR response that materials having a long $T_1$ do not have sufficient time to polarize;

(g) storing the second NMR response to comprise a second image;

(h) subtracting one of the images from the other to obtain a difference between the two images; and (i) evaluating the obtained difference for a null indicative of no explosives in the baggage.

19. The method of claim 18 further including the step of initially polarizing hydrogen nuclei in the baggage, then obtaining the first NMR response and simultaneously depolarizing the hydrogen nuclei; repolarizing hydrogen nuclei having a short $T_1$, and then obtaining the second NMR response.

20. The method of claim 18 including the step of evaluating the obtained difference for explosive indicated by differences exceeding a selected threshold value.

21. The method of claim 20 including the step of spacing the steps of transmitting the RF pulses sufficiently close that long $T_1$ materials in the baggage do not polarize prior to the second step of transmitting RF pulse energy into the baggage.

22. The method of claim 18 including the step of first polarizing in a magnetic field intensity at an elevated intensity;

(a) thereafter changing the magnetic field intensity to a different intensity, the different intensity being determined by that intensity to obtain energy transfer from nitrogen in explosive compounds made of hydrogen and nitrogen, the transfer achieving polarization of the hydrogen in such compounds more rapidly then that indicated by the $T_1$ of such hydrogen; and (b) then obtaining first and second NMR responses from the hydrogen wherein the first response is accomplished with polarized hydrogen in such explosives and the second response is obtained without substantial polarization.

23. The method of claim 22 wherein nitrogen nuclear quadrupole resonance polarity is achieved prior to decreasing the field intensity.

24. The method of claim 18 including the step of obtaining both of said NMR responses in timed sequence after the baggage is polarized in a magnetic field.

25. A method of distinguishing hydrogen in compounds in baggage to detect explosive compounds of hydrogen characterized by a long $T_1$ and short $T_2$ and to distinguish other compounds of hydrogen having a long $T_1$ and long $T_2$ comprising the steps of:

(a) polarizing hydrogen nuclei in a magnetic field;

(b) transmitting a sequence of RF pulses into the baggage at right angles to the polarizing field to form first and subsequent NMR echos from the baggage; and (c) observing the subsequent NMR echos to distinguish long $T_1$, long $T_2$ hydrogen materials by a larger subsequent echo compared to the echo from a long $T_1$, short $T_2$ material.

26. Apparatus for conducting baggage inspection for explosives characterized by having a relatively long $T_1$ and relatively short $T_2$, the apparatus comprising:

(a) a conveyor system for receiving and moving a bag thereon, the bag to be investigated for explosives above a certain quantity therein;

(b) magnet means for forming lines of flux across the path of said conveyor system to intercept baggage thereon for polarizing hydrogen nuclei in the materials of the bag and its contents;

(c) coil means for forming a right angle field to the field formed by said magnet at a selected RF frequency for an interval;
(d) particle resonance detection circuit means connected to said coil means for determining a signal from materials within the baggage;
(e) circuit means connected to said detection means for detecting signals from hydrogen in materials having a long $T_1$ and short $T_2$;
(f) means for digitizing signals from said circuit means;
(g) digital storage means for storing digital data from said digitizing means;
(h) timing means operating an RF pulse forming means to form first and second identical RF pulse trains supplied to said coil means; and
(i) means for subtracting the digitized responses to the first and second RF pulse trains to obtain a null indicative of no long $T_1$ materials in the baggage.

* * * * *